(12) United States Patent
Zhao et al.

(10) Patent No.: US 9,516,754 B2
(45) Date of Patent: Dec. 6, 2016

(54) TRANSPARENT CONDUCTIVE FILM

(71) Applicants: NANCHANG O-FILM TECH CO., LTD., Nanchang (CN); SUZHOU O-FILM TECH CO., LTD., Suzhou (CN); SHENZHEN O-FILM TECH CO., LTD., Shenzhen (CN)

(72) Inventors: Yunhua Zhao, Nanchang (CN); Yulong Gao, Nanchang (CN); Yunliang Yang, Nanchang (CN); Zhao He, Nanchang (CN)

(73) Assignees: NANCHANG O-FILM TECH CO., LTD., Nanchang (CN); SUZHOU O-FILM TECH CO., LTD., Suzhou (CN); SHENZHEN O-FILM TECH CO., LTD., Shenzhen (CN)

( * ) Notice: Subject to any disclaimer, the term of this patent is extended or adjusted under 35 U.S.C. 154(b) by 132 days.

(21) Appl. No.: 14/254,803

(22) Filed: Apr. 16, 2014

(65) Prior Publication Data

US 2014/0353013 A1    Dec. 4, 2014

(30) Foreign Application Priority Data

May 30, 2013    (CN) .......................... 2013 1 0209909

(51) Int. Cl.
*H05K 1/11*    (2006.01)
*H05K 1/02*    (2006.01)
(Continued)

(52) U.S. Cl.
CPC .............. *H05K 1/118* (2013.01); *G06F 3/044* (2013.01); *H05K 1/0289* (2013.01); *H05K 3/107* (2013.01);
(Continued)

(58) Field of Classification Search
CPC ...................................................... G06F 1/1692
(Continued)

(56) References Cited

U.S. PATENT DOCUMENTS

| | | | | |
|---|---|---|---|---|
| 4,587,378 A | * | 5/1986 | Moore | .................... G06F 3/045 345/173 |
| 9,085,194 B2 | * | 7/2015 | Cok | .................... B29C 33/3857 |

(Continued)

FOREIGN PATENT DOCUMENTS

| | | |
|---|---|---|
| CN | 201765581 U | 3/2011 |
| CN | 102063951 A | 5/2011 |
| CN | 102782624 A | 11/2012 |

OTHER PUBLICATIONS

Chinese First Examination Report of corresponding China patent application No. 201310209909.3, dated Jan. 27, 2015.

*Primary Examiner* — Michael F McAllister
(74) *Attorney, Agent, or Firm* — Hodgson Russ LLP

(57) ABSTRACT

A transparent conductive film, including: a transparent substrate, including a body and a flexible connecting component extending from a side of the body, where a width of the flexible connecting component is less than a width of the side of the body from which the flexible connecting component extends, a conductive line is disposed on the flexible connecting component, and the body includes an induction area and a border area; a grid-shaped conductive layer, disposed in the induction area, where the conductive layer includes conductive wires intersecting each other; an lead electrode, disposed in the border area, where the conductive layer and the conductive line are electrically connected via the lead electrode. Since the flexible connecting component and the body are formed as an integrated part, it is unnecessary to separately adhere the flexible connecting compo- (Continued)

nent to the transparent conductive film thereby reducing adhering process and improving production efficiency.

10 Claims, 3 Drawing Sheets

(51) Int. Cl.
    *H05K 3/10*     (2006.01)
    *G06F 3/044*     (2006.01)

(52) U.S. Cl.
    CPC ............... *G06F 2203/04103* (2013.01); *H05K 2201/0108* (2013.01); *H05K 2201/09681* (2013.01)

(58) Field of Classification Search
    USPC .......................................... 174/255; 345/173
    See application file for complete search history.

(56) References Cited

U.S. PATENT DOCUMENTS

| | | | |
|---|---|---|---|
| 2007/0036951 A1* | 2/2007 | Nguyen | C23C 18/1608 428/209 |
| 2007/0103446 A1* | 5/2007 | Chien | G06F 3/045 345/173 |
| 2008/0218492 A1* | 9/2008 | Endo | G06F 3/045 345/173 |
| 2014/0176819 A1* | 6/2014 | Yilmaz | G06F 1/1692 349/12 |

\* cited by examiner

TRANSPARENT CONDUCTIVE FILM

CROSS REFERENCE TO RELATED APPLICATIONS

This application claims priority to Chinese Patent Application No. 201310209909.3, filed on May, 30, 2013, entitled "Transparent Conductive Film", which is hereby incorporated by reference in its entirety.

TECHNICAL FIELD

The present invention relates to the field of touch screen technologies and, in particular, to a transparent conductive film.

BACKGROUND

A transparent conductive film is a thin film which has good conductivity and high transparency within visible waveband. Transparent conductive films have been widely used in the fields of flat panel display, photovoltaic device, touch panel, and electromagnetic shielding, etc., and have extremely broad market potential.

A flexible circuit board, which has a substrate made of polyimide or polyester film, is a highly reliable printed circuit board with excellent flexibility. The flexible circuit board, abbreviated as soft board or FPC (Flexible Printed Circuit), is characterized by high wiring density, light weight and thin thickness. A transparent conductive film is connected to an external circuit through the FPC, so that a position signal sensed by the transparent conductive film can be transferred to a processor and identified, so as to determine the touch location.

However, when connecting an existing transparent conductive film to the external circuit through the FPC, the FPC is adhered to a lead area of the transparent conductive film firstly, and then connected to a printed circuit board (Printed Circuit Board, PCB), which results in low production efficiency.

SUMMARY

Based on this, it is necessary to provide a transparent conductive film in view of the problem of low production efficiency.

A transparent conductive film, includes:

a transparent substrate, including a body and a flexible connecting component extending from a side of the body, where a width of the flexible connecting component is less than a width of the side of the body from which the flexible connecting component extends, a conductive line is disposed on the flexible connecting component, and the body includes an induction area and a border area located at an edge of the induction area;

a grid-shaped conductive layer, disposed in the induction area of the body, where the conductive layer includes conductive wires intersecting each other;

a lead electrode, disposed in the border area of the body, where the grid-shaped conductive layer and the conductive line are electrically connected via the lead electrode.

In one embodiment, a first grid-shaped groove is defined in a surface of the induction area of the body, and the grid-shaped conductive layer is accommodated in the first grid-shaped groove.

In one embodiment, a second grid-shaped groove is defined in a surface of the border area of the body, and the second grid-shaped groove and the first grid-shaped groove are both located on the same side of the body, and the lead electrode is accommodated in the second grid-shaped groove; or the lead electrode is directly formed on the surface of the border area.

In one embodiment, the transparent conductive film further includes a gluey layer disposed on the transparent substrate, and a first grid-shaped groove is defined in a surface of the gluey layer which is away from the transparent substrate and corresponds to the induction area, and the grid-shaped conductive layer is accommodated in the first grid-shaped groove.

In one embodiment, a second grid-shaped groove is defined in a surface of the gluey layer which is away from the transparent substrate and corresponds to the border area, and the lead electrode is accommodated in the second grid-shaped groove; or the lead electrode is directly formed on the surface of the gluey layer which is away from the transparent substrate and corresponds to the border area.

In one embodiment, a material of the gluey layer is curable adhesive, embossed plastic or polycarbonate.

In one embodiment, a width of the first grid-shaped groove is 0.2 μm~5 μm, a height of which is 2 μm~6 μm, and a height to width ratio of the first grid-shaped groove is greater than 1; and a width of the second grid-shaped groove is 0.2 μm~5 μm, a height of which is 2 μm~6 μm, and a height to width ratio of the second grid-shaped groove is greater than 1.

In one embodiment, a bottom of the first grid-shaped groove and/or a bottom of the second grid-shaped groove are of a non-planar structure.

In one embodiment, the lead electrode is grid-shaped or strip-shaped, and the grid-shaped lead electrode is formed by conductive wires intersecting each other, and a minimal width of the strip-shaped lead electrode has a range of 10 μm~200 μm, and a height of the strip-shaped lead electrode has a range of 5 μm~10 μm.

In one embodiment, the conductive line is grid-shaped or strip-shaped, and the grid-shaped conductive line is formed by conductive wires intersecting each other.

In one embodiment, a material of the transparent substrate is polyethylene terephthalate, polycarbonate, or polymethylmethacrylate.

In one embodiment, a material of the conductive wires is at least one of a conductive metal, a carbon nano-tube, a graphene ink, and a conductive polymer material.

In one embodiment, the transparent conductive film further includes a transparent protective layer, where the transparent protective layer covers at least a part of the transparent substrate, the grid-shaped conductive layer, and the lead electrode.

According to the above transparent conductive film, the flexible connecting component is formed by extending from a side of the body, where a conductive line is disposed on the flexible connecting component; a conductive layer is disposed in the induction area of the body, a lead electrode is disposed in the border area; and the conductive layer and the conductive line are electrically connected via the lead electrode. Therefore, since the flexible connecting component is formed by extending from a side of the body of the transparent substrate, that is, the flexible connecting component and the body is formed as an integrated part, it is unnecessary to separately adhere the flexible connecting component to the transparent conductive film, thereby reducing the adhering process and improving the production efficiency.

DESCRIPTION OF EMBODIMENTS

In order to make the objectives, characteristics and advantages of the transparent conductive film more clear and understandable, the following comprehensively describes embodiments of the transparent conductive film with reference to the accompanying drawings. In the following, details of embodiments are described for facilitating comprehensive understanding of the transparent conductive film. However, the transparent conductive film can be implemented in many ways other than those embodiments described herein. Persons skilled in the art can make similar improvements without departing from the principle of the present invention, thus, the transparent conductive film is not limited to the following disclosed embodiments.

Unless defined otherwise, meanings of all technical and scientific terminologies used by this description are the same as the meaning understood by those skilled in the art of transparent conductive films. The terminologies in the specification describing the transparent conductive film are used for describing specific embodiments, instead of limiting the transparent conductive film. The terminology "and/or" used herein includes any and all combinations of one or more relevant listed items.

Further descriptions of the transparent conductive film will be shown as follows in combination with drawings and embodiments.

Figure 1:
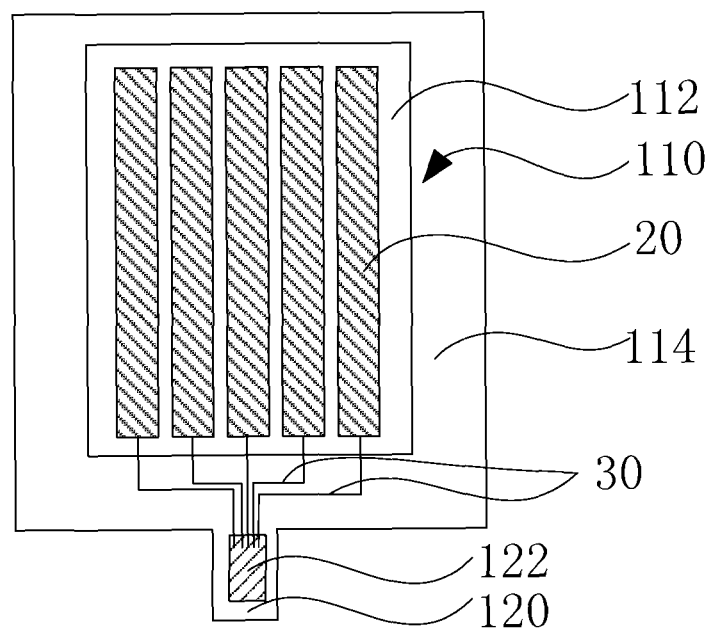
FIG. 1 is a schematic structural diagram of a transparent conductive film according to an implementing mode of the present invention.
Figure 2:
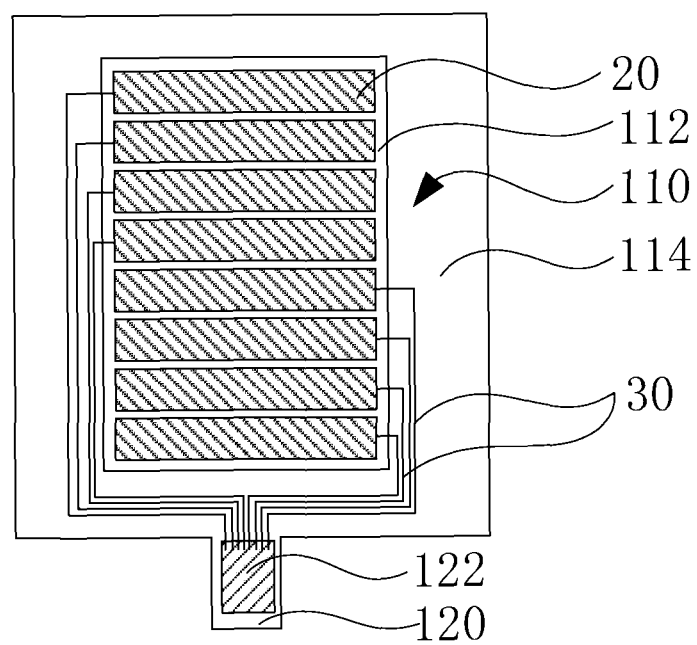
FIG. 2 is a schematic structural diagram of a transparent conductive film according to another implementing mode of the present invention.
Figure 3:
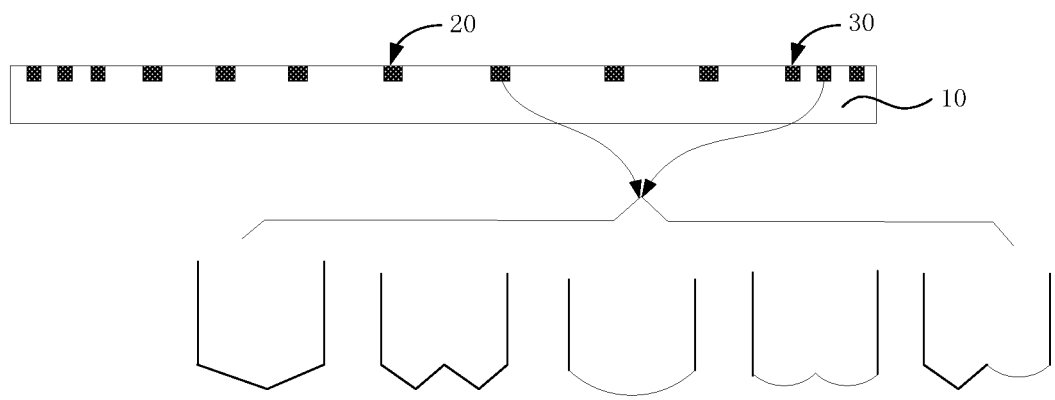
FIG. 3 is a schematic structural diagram of a transparent conductive film according to embodiment one of the present invention.

With reference to FIG. 1~FIG. 3, a transparent conductive film includes a transparent substrate 10, a conductive layer 20, and a lead electrode 30. The transparent substrate 10 includes a body 110 and a flexible connecting component 120 formed by extending from a side of the body 110, where the width of the flexible connecting component 120 is less than the width of the side of the body 110 from which the flexible connecting component 120 extends, a conductive line 122 is disposed on the flexible connecting component, and the body 110 includes an induction area 112 and a border area 114 located at the edge of the induction area 112; the conductive layer 20 is disposed in the induction area 112 of the body 110, where the conductive layer 20 includes conductive wires intersecting each other, and the conductive wires intersect each other to form a grid-shaped conductive layer 20; the lead electrode 30 is disposed in the border area 114 of the body 110, where the conductive layer 20 and the conductive line 122 are electrically connected via the lead electrode 30. According to this embodiment, the lead electrode 30 and the conductive layer 20 are both located on the same side of the transparent substrate 10. As shown in FIG. 1, it indicates a transparent conductive film of which the grids of the conductive layer 20 are laterally arranged; as shown in FIG. 2, it indicates a transparent conductive film of which the grids of the conductive layer 20 are longitudinally arranged; as shown in FIG. 3, it indicates a sectional view of the transparent conductive film regarding FIG. 1 or FIG. 2.

According to the above transparent conductive film, the flexible connecting component 120 is formed by extending from a side of the body 110, the conductive line 122 is disposed on the flexible connecting component 120, the conductive layer 20 is disposed in the induction area 112 of the body 110, the lead electrode 30 is disposed in the border area 114, and the conductive layer 20 and the lead electrode 30 are both located on the same side of the transparent substrate 10, where the conductive layer 20 and the conductive line 122 are electrically connected via the lead electrode 30. Since the flexible connecting component 120 is formed by extending from a side of the body 110 of the transparent substrate 10, that is, the flexible connecting component 120 and the body 110 are formed as an integrated part, it is unnecessary to separately adhere the flexible connecting component 120 to the transparent conductive film, thereby reducing the adhering process and improving the production efficiency; the connection between the flexible connecting component 120 and an external device can be realized via adhering, or via direct plug-in connecting by providing a male or female end at the end portion of the flexible connecting component 120.

In one embodiment, the material of the transparent substrate 10 can be polyethylene terephthalate (Polyethylene terephthalate, PET), polycarbonate (Polycarbonate, PC) or polymethylmethacrylate (Polymethylmethacrylate, PMMA). In this embodiment, the material of the substrate 113 is terephthalate, and preferably it is a transparent insulating material.

Figure 4:
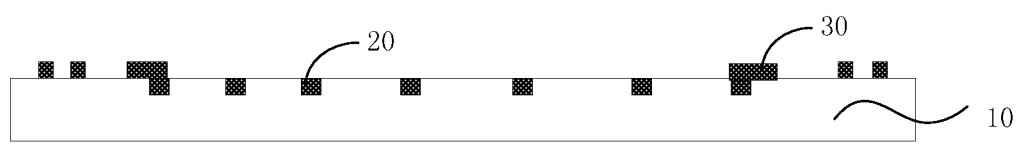
FIG. 4 is a schematic structural diagram of a transparent conductive film according to embodiment two of the present invention.

With reference to FIG. 3~FIG. 4, according to embodiments 3 and 4, a first grid-shaped groove is defined in the surface of the induction area 112 of the body 110, and the conductive layer 20 is accommodated in the first grid-shaped groove. On the surface of the induction area 112 of the body 110, the first grid-shaped groove is formed through embossing by using a graphical embossing-plate corresponding to the grid-shaped conductive layer 20, a conductive material is filled into the first grid-shaped groove and solidified through sintering to form conductive wires intersecting each other, therefore, the grid-shaped conductive layer 20 is formed. Therefore, the conductive layer 20 can obtain a pre-set pattern by filling conductive material into the first grid-shaped groove, where the first grid-shaped groove can be formed in one step via an embossing mold, rather than using graphical etching, thereby simplifying the process, and improving production efficiency. Especially, when ITO is used as the conductive material, because there is no etching, it reduces material waste, and further saves cost. The first grid-shaped groove is adopted to form the conductive layer 20, therefore, the conductive material is not limited to traditional ITO, thus it increases the options of available conductive materials. It may further reduce the thickness of the transparent conductive film, and increase the light transmittance of the transparent conductive film, where the visible light transmittance of the transparent conductive film is no less than 86%.

In one embodiment, the grids of the conductive layer 20 are formed by the conductive wires intersecting each other. The conductive wires are formed by solidifying the conductive material filled into the first grid-shaped groove. The material of the conductive layer 20 can be at least one of a conductive metal, a carbon nano-tube, a graphene ink, and a conductive polymer material. The conductive metal can include gold, silver, copper, aluminum, nickel and zinc, or one of alloys of at least two of them. In the embodiment, the conductive material is nano-silver ink, the solid content of the silver ink is 35%; it is filled in the first grid-shaped groove, and becomes a solid flexible silver wire after sintering. The sintering temperature can be selected as 150° C. It can be understood that corresponding functions can be realized as long as the material of the conductive layer 20 is a electrical conductor.

With reference to FIG. 3, in embodiment one, a second grid-shaped groove is defined in the surface of the border area 114 of the body 110, the first grid-shaped groove and the second grid-shaped groove are both on the same side of the body 110, and the lead electrode 30 is accommodated in the second grid-shaped groove. Conductive material is filled into the second grid-shaped groove, and solidified to form the grid-shaped lead electrode 30; and the lead electrode 30 includes conductive wires intersecting each other. The conductive layer 20 and the conductive line 122 are electrically connected via the lead electrode 30, so as to transfer touch signals detected by the induction area to the conductive line 122. The function of the second grid-shaped groove and that of the first grid-shaped groove are the same, as described above, which will not be repeated. In order to save cost, the material of conductive wires can be a conductive metal, and the conductive metal can be silver or copper.

With reference to FIG. 4, in embodiment two, the lead electrode 30 can be directly formed on the surface of the border area 114 of the body 110. The lead electrode 30 and the conductive layer 20 are on the same side of the body 110. Here the lead electrode 30 can be formed by screen printing or inkjet printing, so as to form a strip-shaped lead electrode 30. The minimal width of the strip-shaped lead electrode 30 can be 10 µm~200 µm, and the height can be 5 µm~10 µm.

In one embodiment, the conductive line 122 is embedded at the flexible connecting component 120. The flexible connecting component 120 is provided with a third grid-shaped groove (not shown), and the conductive line 122 is accommodated in the third grid-shaped groove. Fill The conductive material is filled into the third grid-shaped groove, and solidified to form the grid-shaped conductive line 122, and the conductive line 122 includes conductive wires intersecting each other. In the embodiment, in order to electrically connect the conductive layer 20 and the conductive line 122 via the lead electrode, the first grid-shaped groove, the second grid-shaped groove and the third grid-shaped groove are all on the same side of the body 110. In other embodiments, the conductive line 122 can also be directly formed on the surface of the flexible connecting component 120, and the conductive line 122 is strip-shaped. The function of the third grid-shaped groove and that of the first grid-shaped groove are the same, as described above, which will not be repeated. In order to save cost, the material of the conductive wires can be a conductive metal, and the conductive metal can be silver or copper.

For the convenience of description, the first grid-shaped groove, the second grid-shaped groove and the third grid-shaped groove are all generally called grid-shaped groove unless otherwise indicated. In combination with FIG. 3, the bottom of the grid-shaped groove is of a non-planar structure. The shape of the non-planar structure at the bottom of the grid-shaped groove can be a single V shape or a single circular arc shape, the shape of the non-planar structure can also be a regular zigzag shape composed of many V shapes, a wave shape composed of many circular arc shapes, or a non-planar structure composed of V shapes and circular arc shapes. Of course the non-planar structure can be other shapes, as long as the bottom of the grid-shaped groove is of non-flatness. The fluctuating amplitude in the thickness direction of the non-planar structure is 500 nm~1000 nm. Because the conductive material is liquid before being filled, when the liquid conductive material is filled into the grid-shaped groove, the non-flatness of the bottom of the grid-shaped groove is beneficial for dispersing the tension generated when the liquid conductive material comes into contact with the bottom of the grid-shaped groove, so as to avoid the liquid conductive material shrinking into ball shaped or near ball shaped structures due to large tension, reduce the possibility of ball shapes or near ball shapes separated from each other being formed in the conductive material after sintering, improve the connectivity inside the conductive material after sintering, and guarantee the conductive performance of the transparent conductive film.

Because the conductive material belongs to a three dimensional (3D), aeolotropic substance, its coefficient of thermal expansion in the direction parallel to the layer surface direction is less than that in the direction vertical to the layer surface direction. Therefore, when sintering after filling the conductive material into the grid-shaped groove, if the depth of the grid-shaped groove is less than its width, a too large tensile stress can be generated in the direction vertical to the layer surface direction which may cause the conductive material to break. Therefore, the ratio of the height to the width of the grid-shaped groove can be set greater than 1, the width of the grid-shaped groove can be 0.2 µm~5 µm, and the height can be 2 µm~6 µm.

Figure 7:
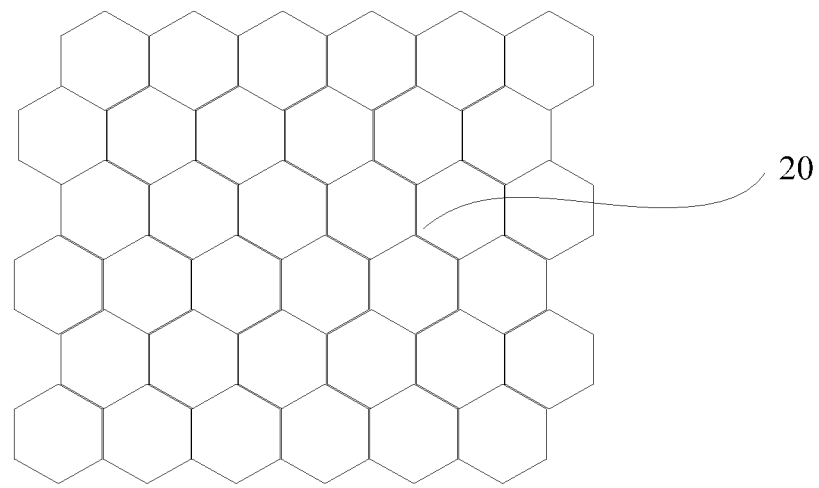
FIG. 7 is a schematic structural diagram of a grid-shaped conductive layer according to an implementing mode of the present invention.
Figure 8:
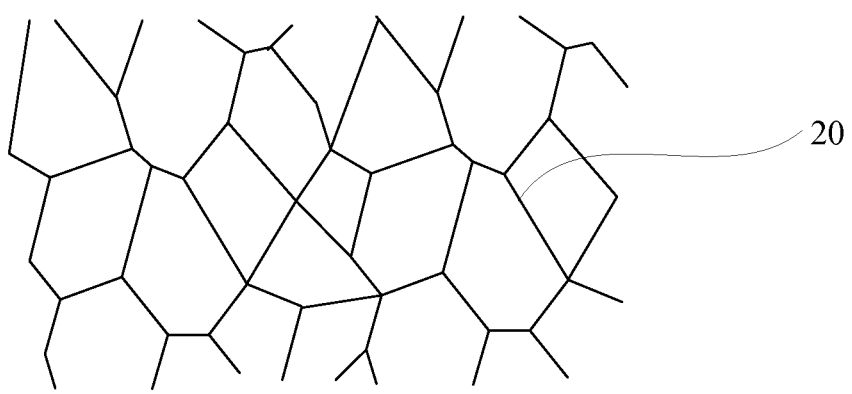
FIG. 8 is a schematic structural diagram of a grid-shaped conductive layer according to another implementing mode of the present invention.

The grid shape of the grid-shaped groove can be a regular grid or a random grid. After filling the conductive material into the grid-shaped groove, conductive layer 20 of regular grid or random grid, lead electrode 30 and conductive line 122 can be formed. As shown in FIG. 7, it indicates a conductive layer 20 of regular grid. As shown in FIG. 8, it indicates a conductive layer 20 of random grid. The grid of the grid-shaped groove includes many grid units; a regular grid indicates that the grid cycles of all grid units are the same, and the grid cycle refers to the size of each grid unit. Thus, when the transparent conductive film is adhered to other display devices, especially to display devices with relatively small displaying screen, it can avoid displaying disorder of a picture.

The random grid indicates the grid cycles of at least two grid units are different. When the transparent conductive film is adhered to other display devices the generation of moire fringe is avoided. Moire fringe is an optical phenomenon, which is a visual result of interference between two lines or two objects at a constant angle and frequency. When human eyes cannot distinguish the two lines or two objects, only the interfering patterns can be seen, such optical phenomenon is moire fringe. The shape of a grid unit of the conductive layer 20 can be rhombus, rectangle, parallelogram, curve trapezoid or polygon. The curve trapezoid has four curves, and two opposite curves have the same shape and curve orientation.

Figure 5:
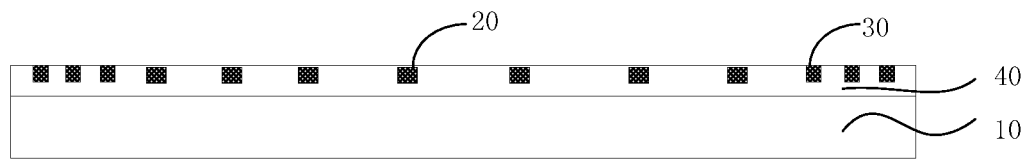
FIG. 5 is a schematic structural diagram of a transparent conductive film according to embodiment three of the present invention.
Figure 6:
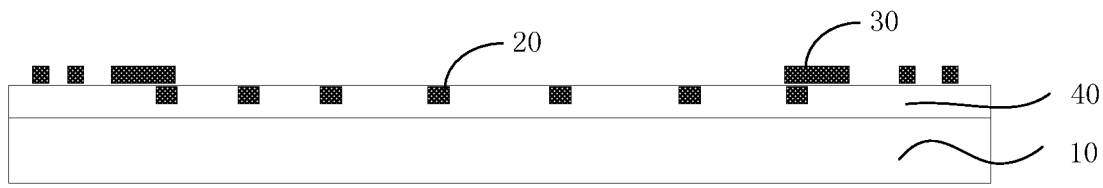
FIG. 6 is a schematic structural diagram of a transparent conductive film according to embodiment four of the present invention.

With reference to FIG. 5 and FIG. 6, in embodiment three and four, the transparent conductive film also includes a gluey layer 40 disposed on the transparent substrate 10, and a first grid-shaped groove is defined in a surface of the gluey layer 40 which is away from the transparent substrate 10 and corresponds to the induction area 112, and the conductive layer 20 is accommodated in the first grid-shaped groove. The gluey layer 40 is coated on the surface of the transparent substrate 10, the first grid-shaped groove is formed through embossing the surface of the gluey layer 40 which is away from the transparent substrate 10 and corresponds to the induction area 112, by using a graphical embossing-plate corresponding to the grid-shaped conductive layer 20, a conductive material is filled into the first grid-shaped groove to form the conductive layer 20. The gluey layer 40 can be used for insulation and pattern formation.

In one embodiment, the material of the gluey layer 40 may be curable adhesive, embossed plastic or polycarbonate.

With reference to FIG. 5, in embodiment three, a second grid-shaped groove is defined in a surface of the gluey layer 40 which is away from the transparent substrate and corresponds to the border area 114, and the lead electrode 30 is accommodated in the second grid-shaped groove. The conductive material is filled into the second grid-shaped groove, and solidified to form a grid-shaped lead electrode 30; and the lead electrode 30 includes conductive wires intersecting each other. The conductive layer 20 and the conductive line 122 are electrically connected via the lead electrode 30, so as to transfer touch signals detected by the induction area to the conductive line 122.

With reference to FIG. 6, in embodiment four, the lead electrode 30 can be directly formed on the surface of the gluey layer 40 which is away from the transparent substrate 10 and corresponds to the border area 114. The lead electrode 30 and the conductive layer 20 are located on the same side of the gluey layer 40. Here the lead electrode 30 can be formed by screen printing or inkjet printing, so as to form a strip-shaped lead electrode 30. The minimal width of the strip-shaped lead electrode 30 can be 50 µm~200 µm, and the height can be 5 µm~10 µm.

In one embodiment, the transparent conductive film can also include a transparent protective layer (not shown), the transparent protective layer covers at least a part of the transparent substrate 10, the conductive layer 20, and the lead electrode 30. The material of the transparent protective layer may be ultraviolet curable adhesive (UV adhesive), embossed plastic or polycarbonate. The transparent protective layer is disposed on the transparent conductive film to efficiently prevent the conductive material from oxidation.

The foregoing embodiments merely describe several implementing modes of the present invention with specific details, but should not be interpreted as limiting the scope of the present invention. It should be noted that persons of ordinary skill in the art may make variants and modifications without departing from the conception of the present invention, all of these variants and modifications fall within the protection scope of the present invention. Accordingly, the protection scope of the present invention should subject to the appended claims.

What is claimed is:

1. A transparent conductive film, comprising:
    a transparent substrate, comprising a body and a flexible connecting component extending from a side of the body, wherein a width of the flexible connecting component is less than a width of the side of the body from which the flexible connecting component extends, a conductive line is disposed on the flexible connecting component, and the body comprises an induction area and a border area located at an edge of the induction area;
    a grid-shaped conductive layer, disposed in the induction area of the body, wherein the conductive layer comprises conductive wires intersecting each other;
    a lead electrode, disposed in the border area of the body, wherein the grid-shaped conductive layer and the conductive line are electrically connected via the lead electrode;
    a first grid-shaped groove is defined in a surface of the induction area of the body, and the grid-shaped conductive layer is accommodated in the first grid-shaped groove;
    a second grid-shaped groove is defined in a surface of the border area of the body, and the second grid-shaped groove and the first grid-shaped groove are both located on the same side of the body, and the lead electrode is accommodated in the second grid-shaped groove or the lead electrode is directly formed on the surface of the border area;
    the lead electrode is grid-shaped or strip-shaped, and the grid-shaped lead electrode is formed by conductive wires intersecting each other, and the strip-shaped lead electrode has a minimal width of 10 µm~200 µm, and a height of 5 µm~10 µm;
    wherein a width of the first grid-shaped groove is 0.2 µm~5 µm, a height of which is 2 µm~6 µm, and a height to width ratio of the first grid-shaped groove is greater than 1; and
    wherein a width of the second grid-shaped groove is 0.2 µm~5 µm, a height of which is 2 µm~6 µm, and a height to width ratio of the second grid-shaped groove is greater than 1.

2. The transparent conductive film according to claim 1, further comprising a gluey layer, disposed on the transparent substrate, and the first grid-shaped groove is defined in a surface of the gluey layer which is away from the transparent substrate and corresponds to the induction area, and the grid-shaped conductive layer is accommodated in the first grid-shaped groove.

3. The transparent conductive film according to claim 2, wherein the second grid-shaped groove is defined in a surface of the gluey layer which is away from the transparent substrate and corresponds to the border area, and the lead electrode is accommodated in the second grid-shaped groove; or
    the lead electrode is directly formed on the surface of the gluey layer which is away from the transparent substrate and corresponds to the border area.

4. The transparent conductive film according to claim 2, wherein a material of the gluey layer is curable adhesive, embossed plastic or polycarbonate.

5. The transparent conductive film according to claim 1, wherein a bottom of the first grid-shaped groove and/or a bottom of the second grid-shaped groove are of a non-planar structure.

6. The transparent conductive film according to claim 3, wherein a bottom of the first grid-shaped groove and/or a bottom of the second grid-shaped groove are of a non-planar structure.

7. The transparent conductive film according to claim 1, wherein the conductive line is grid-shaped or strip-shaped, and the grid-shaped conductive line is formed by conductive wires intersecting each other.

8. The transparent conductive film according to claim 1, wherein a material of the transparent substrate is polyethylene terephthalate, polycarbonate, or polymethylmethacrylate.

9. The transparent conductive film according to claim 1, wherein a material of the conductive wires is at least one of a conductive metal, a carbon nano-tube, a graphene ink, and a conductive polymer material.

10. The transparent conductive film according to claim 1, further comprising a transparent protective layer, wherein the transparent protective layer covers at least a part of the transparent substrate, the grid-shaped conductive layer, and the lead electrode.

\* \* \* \* \*